United States Patent [19]
Balg et al.

[11] Patent Number: 6,092,971
[45] Date of Patent: Jul. 25, 2000

[54] WAFER GRIPPING DEVICE ADAPTED TO SWIVEL WAFERS TAKEN FROM A HORIZONTAL POSITION IN A STORAGE CONTAINER

[75] Inventors: Christian Balg, Ermatingen; Bernhard Strasser, Taegerwilen; Jakob Blattner, Ermatingen, all of Switzerland

[73] Assignee: Staeubli AG, Pfaeffikon, Switzerland

[21] Appl. No.: 08/889,150

[22] Filed: Jul. 7, 1997

[30] Foreign Application Priority Data

Oct. 9, 1996 [CH] Switzerland ............... 2458/96

[51] Int. Cl.⁷ .................................. B65G 65/00
[52] U.S. Cl. ............... 414/416; 294/103.1; 414/941; 414/937; 414/938; 414/740; 269/86
[58] Field of Search ............... 414/935, 936, 414/937, 938, 732, 740, 941, 939, 222, 225, 217, 416, 417, 404; 118/719, 500; 269/86, 152; 294/103.1

[56] References Cited

U.S. PATENT DOCUMENTS

| | | | |
|---|---|---|---|
| 4,639,028 | 1/1987 | Olson | 294/103.1 X |
| 4,848,814 | 7/1989 | Suzuki et al. | |
| 4,900,214 | 2/1990 | Ben | 294/103.1 X |
| 4,971,512 | 11/1990 | Lee et al. | 294/103.1 X |
| 5,004,399 | 4/1991 | Sullivan et al. | |
| 5,183,370 | 2/1993 | Cruz | |
| 5,590,996 | 1/1997 | Thompson et al. | 414/937 X |
| 5,615,988 | 4/1997 | Wiesler et al. | |
| 5,882,168 | 3/1999 | Thompson et al. | 414/941 X |

OTHER PUBLICATIONS

International Search Report.

*Primary Examiner*—Frank E. Werner
*Attorney, Agent, or Firm*—Evenson, McKeown, Edwards & Lenahan, P.L.L.C.

[57] ABSTRACT

For removing and transporting several spaced, parallel wafers stored in a container, a gripping device is provided. The gripping device has a holding rake and several gripping heads which can be rotated with respect to the holding rake. In one swivel position, the gripping heads are moved through between the wafers and then swivelled into another swivel position. In this latter position, the gripping heads are brought to a stop against the edges of the wafers movement of the gripping device, and then the opposite edges of the wafer disks are brought to stop against the counterholder by displacement of the counterholder. All wafers contained in the container are thus simultaneously securely held and can be displaced out of the container. In order to then swivel the wafers, the holding rake which has slots for receiving the wafer edges is also stopped at the wafer edges, and the counterholder is then pushed back. The wafers are therefore securely swivelled. In the swivelled position, the vertically standing wafers are supplied to a processing carrier.

23 Claims, 4 Drawing Sheets

WAFER GRIPPING DEVICE ADAPTED TO SWIVEL WAFERS TAKEN FROM A HORIZONTAL POSITION IN A STORAGE CONTAINER

BACKGROUND AND SUMMARY OF THE INVENTION

This application claims the priority of 2458/96, the disclosure of which is expressly incorporated by reference herein.

The present invention relates to a gripping device for wafers which are stacked and spaced in a container as well as to a process for gripping and transporting the wafers.

The processing or handling of wafers such as semiconductor plates requires different process steps. Conventionally crude or unprocessed wafers are produced and are intermediately stored in containers. For the actual processing operation, these wafers must be removed from the container, must be supplied to an arrangement for carrying out the processing operation and must then be deposited again in a container. A basic problem during the overall processing and intermediate storage is the fact that the unprocessed wafers must be kept away from contaminations and dirt. Even the smallest contamination by dust or other particles causes damage to the corresponding area of the wafer surface. This damage can result in considerable failure rates of the end products produced from these wafers. For this reason, the processing normally takes place by so-called clean-room technology. That is, the processing zones must have a certain, determined cleanliness with respect to these dirt particles. The same also applies to the intermediate storage, i.e., the storage containers.

The removal and feeding of the wafers conventionally takes place either manually or automatically. The manual operation always increases the danger of a contamination. Hence an automatic operation is usually desired.

Conventionally, such wafers were produced and processed with a diameter of up to 200 mm. These wafers are conventionally stored in a vertically standing manner in cassettes which are especially designed for that purpose. For the removal and feeding, these wafers must only be taken in this vertical position out of the box and must be slid back into the box. For this purpose, suitable arrangements are known which come to a stop against the edge of the wafer. For this purpose, the wafers are inserted into rake-type holding devices which can simply be moved out of and into the boxes. The holding arrangements are designed such that the edge zones of the wafers are partially exposed so that the removal devices can be applied to this edge zone. The wafers can be touched by this device only on their edge sections extending perpendicularly to the surface as well as in a narrowly limited area on the periphery of the rear side.

Particularly newer larger wafers (up to 300 mm or larger) are now, for the most part, no longer stored vertically but horizontally in containers. These wafers must now be taken out of these containers and must then be swivelled into a different position, frequently by 90°, before they can be supplied to the downstream processing device. Conventionally no devices are known for this removal and swivel movement.

An object of the present invention is to provide a gripping device which can take horizontally stored wafers from their container and can feed them to a processing carrier in a swivelled position.

According to the present invention, this object has been achieved by a gripper device having at least one displaceable holding rake with slots configured to receive the wafers, swivellable rods provided with gripping heads having stop surfaces for stopping against edges of the wafers, and at least one counterholder having an elastic stop surface aligned substantially perpendicularly to a surface of the wafers.

The gripping device according to the present invention allows horizontally disposed wafers to be taken out of their storage container, swivelled, supplied to a processing carrier and positioned thereon. This completely meets the requirements concerning the area of the wafer which is not be touched by any objects because the gripping devices come in contact with the wafer essentially only at the edge and not on the disk surface. Nevertheless, the wafers are held in a stable manner and can therefore be swivelled advantageously into virtually any position. Advantageously, this can take place in a completely automated manner. The device can therefore be installed and operated in a closed-off area of a processing machine.

As the result of a preferred swivelling range of 90°, for the sliding-in between the stacked wafers, the gripping heads can advantageously be swivelled into their slide-in position. In this position, they can be moved without any problem into the space between the wafers without any contact with the surfaces of the wafers.

Because of the preferred feature of the holding or slot surfaces, the wafers are advantageously touched only on their marginal edge. That is, their surface is virtually untouched. This results particularly from the inclination of the slot surface directed against the bottom side of the wafers.

The same effect is achieved by a preferred aspect of the holding rake or the development of its slots. As a result, an advantageous secure and stable fit of the wafers is achieved without any change of their positions and particularly of their spacing.

Preferably, two gripping heads respectively are provided for one disk and come together, in a mutually spaced manner, to a stop against the edge area of one wafer respectively. For gripping of a stack of, for example, thirteen wafers, advantageously all gripping heads are simultaneously swivelled together.

Preferably, gripping devices of the aforementioned type according to the present invention are used in wafer processing systems. Furthermore, according to the present invention the process for achieving the object provides the step of while the container is open, displacing the gripping device, moving the grippers through an opening of the container between the wafers to edge areas thereof opposite the container opening, contacting the grippers with the edge areas of the wafers as a result of a pulling movement of the gripping device, and then displacing the counterholder from a starting position to come to a stop against an edge of the wafers, and lifting the wafers via the gripping device by lifting the wafers from a respective support in the container and removing the wafers from the container, and displacing the positioning rake, having one slot respectively for each of the wafers, against the edges of the wafers, whereupon the wafers come to rest against a stop in the slots, and then sliding the counterholder is back into the starting position.

Advantageously, before the wafer stack is removed from its container, the gripping device according to the present invention is slightly lifted so that the wafers are detached from their holding devices in the container. This approach prevents damage to the wafer surfaces by the holding devices which may occur if the wafers were simply pulled out and slide across the holding devices.

BRIEF DESCRIPTION OF THE DRAWINGS

Other objects, advantages and novel features of the present invention will become apparent from the following detailed description of the invention when considered in conjunction with the accompanying drawings wherein.

DETAILED DESCRIPTION OF THE DRAWINGS

Figure 1:
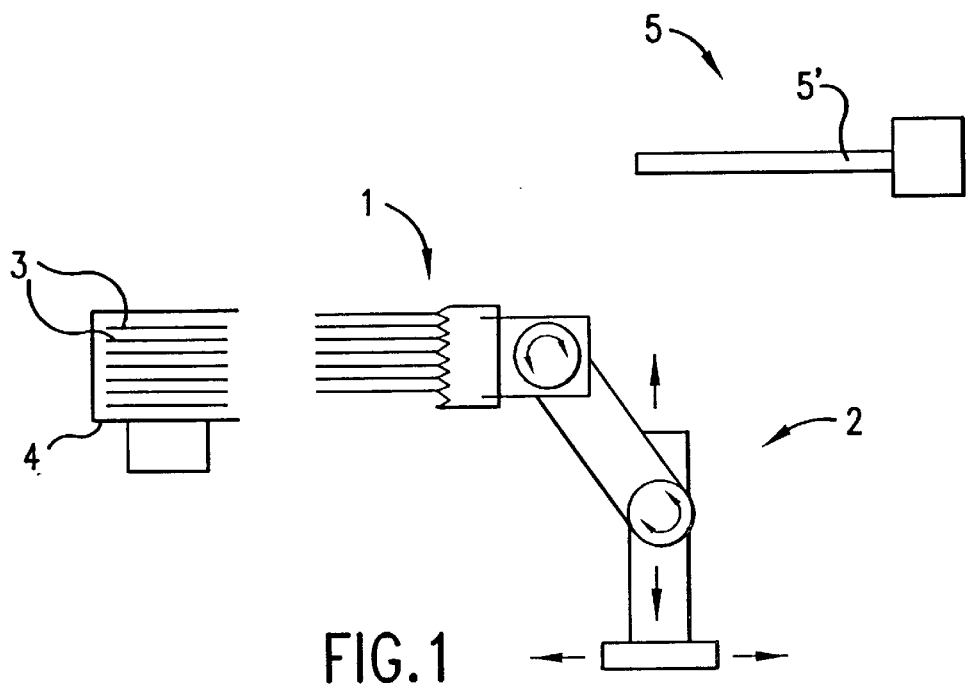
FIG. 1 is a schematic view of a gripping device according to the present invention in a state before the wafers are removed from their container.

In FIG. 1, a gripping device 1 according to the present invention is on a movable and swivellable carrier 2. The unprocessed wafers 3 are arranged horizontally and are spaced away from one another in their container 4. In this case, the wafers 3 are stored in this container 4 such that only the wafer disk edges and optionally a narrow edge area of the bottom side of the wafer disk are in contact with the holding elements in the container 4.

After their manufacture, the wafer disks 3 are filled into these containers 4 and are stored there until they are supplied to another processing step. The gripping device 1 moves the wafers 3 out of their container 4 and transfers them to a processing carrier 5, for example, two parallel rollers 5' on which the round wafers 3 are placed in a vertically aligned manner as will be explained below.

The container 4 can now be moved, for example, by a controlled transport device to an evacuating position. In the case of this evacuating position, the opening of the transport device is preferably situated in the clean-room area. At this position illustrated in FIG. 1, the front cover (not shown) of the container 4 is also removed, whereby the wafers 3 become accessible to the gripping device 1.

The gripping device 1 is now moved by way of the carrier 2 in front of the opening of the container 4, and its grippers grip and fix the wafers 3 on the gripping device 1. Subsequently, the gripping device 1, together with the wafers 3, can be moved out of the container 4 and, because of the mobility of the carrier 2, can be swivelled into the desired vertical alignment.

Figure 2:
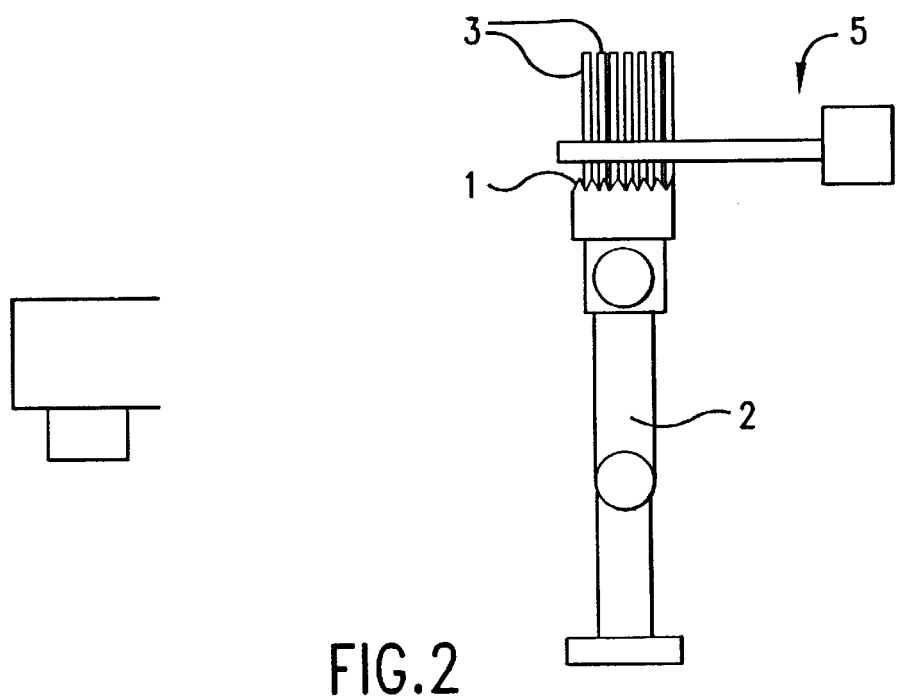
FIG. 2 is a view similar to FIG. 1 but during the feeding of the wafers to the processing carrier.

FIG. 2 is a schematic view of the positioning of the wafers 3 swivelled into the vertical position on the processing carrier 5. The rollers 5' of the processing carrier 5 are preferably configured such that the wafer disks 3 can be slid from below through between the rollers 5', and then by rotation of the rollers 5' about their own axes, the wafer disks 3 can be caused to rest with their disk edges on the rollers 5'. For example, for this purpose, the rollers 5' have a circular cross-section which, in a particular segment area, is flattened, for example, by 90°.

By lowering the carrier 2, the gripping device 1 can now be moved out between the wafers 3 and the wafers 3 can be supplied to a process step by the processing carrier 5. Following the completed processing operation, the processed wafers 3 can be supplied again in inverse order to a container 4 by the gripping device 1 and can then be conveyed.

The above-described operation which can in its entirety be automatically controlled and requires no manual intervention, can take place completely in the clean space of the processing machine. This advantageously reduces the risk of contamination and therefore also the rate of failure of the wafers 3 during the processing operation in comparison to the manual feeding and removal of the wafers 3, and, in addition, a higher processing rate can be achieved.

Figure 3:
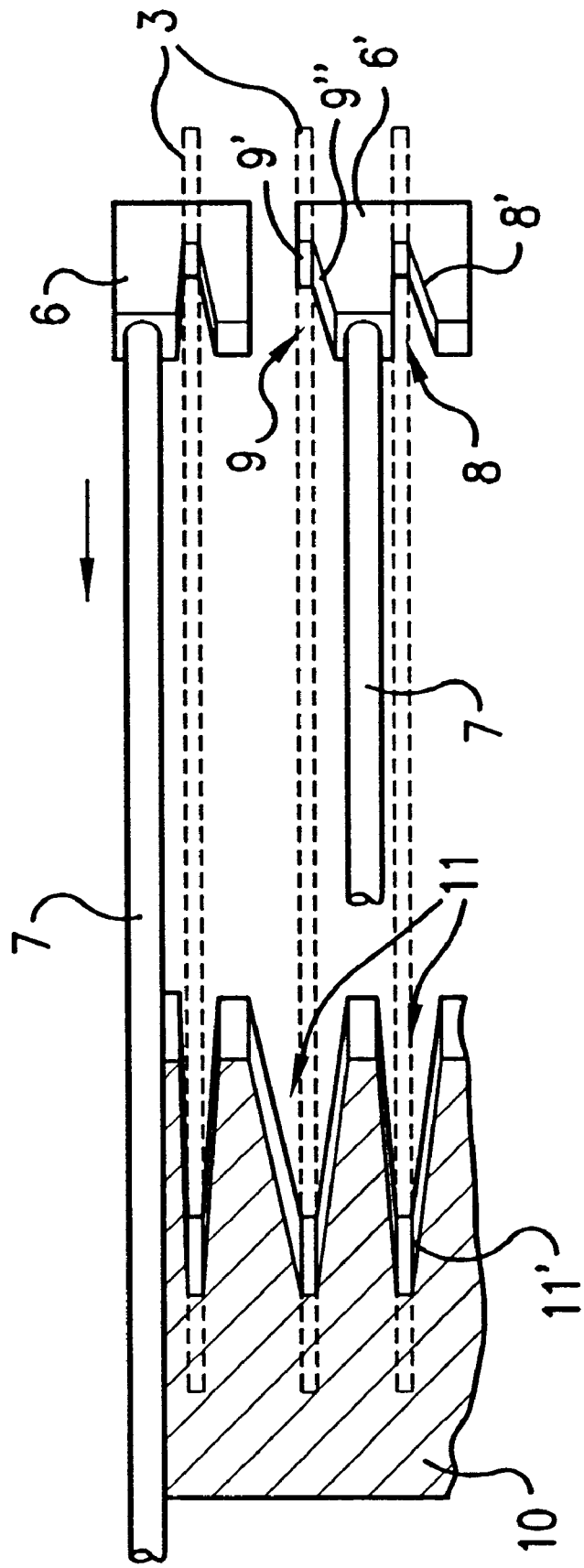
FIG. 3 is a longitudinal sectional view of an area of a gripping device according to the present invention.

The construction of the gripping device 1 according to the invention is now shown in detail in the example in FIG. 3, partially as a longitudinal sectional view.

For pulling the wafers 3 out of their container 4, gripping heads 6 are provided which are arranged at one end of rods 7 which can be rotated about their axis. The gripping heads 6 have a slot 8 which is constructed to be slightly larger than the thickness of the wafers 3, and with lower cheek 8', which comes to rest against the bottom side of the wafer plate 3 (shown in dashed lines), is aligned at a flat angle with respect to the wafer surface.

In the position illustrated in FIG. 3, pulling-back of its rod 7 in the direction of the arrow causes the gripping head 6 to be pulled in the same direction against the lateral edge of the corresponding wafer 3. This takes place by movement of the entire gripping device 1. As a result, the lateral edge of the wafer 3 comes to a stop against the bottom of the slot 8. The construction of the slot 8 with the angled lower cheek arranged at an angle results in the surface of the wafer 3 not coming in contact with the grippers.

As examples, FIG. 3 shows two different constructions of the gripping head 6. The upper gripping head 6 is configured for gripping a single wafer plate 3 and has a single slot 8. This gripping head is advantageously used as a starting or end gripper in the gripping device 1. The lower gripping head 6' is configured for simultaneous gripping two wafers 3 and, in addition to the lower slot 8, has a second cutout 9 with a cheek surface 9' aligned at a flat angle with respect to the wafer surfaces as well as a vertical stop face 9".

In order to pull the wafers 3 out of their holding device in the magazine 4, a stop element 16 is displaced from the side opposite the gripping heads 6 against the edges of the wafers 3 and is caused to stop there. The gripping device 1 can now be slightly lifted with respect to the magazine 4 whereby the wafers 3 are lifted from their holding device in the magazine 4 and, with a back movement are removed completely from the magazine 4. Then a holding rake 10 is moved from the same side as the stop element 16 against the wafers 3.

This holding rake 10 also has slots 11 for receiving the wafers 3 as seen in FIG. 3. These slots are essentially constructed in a wedge shape, in which case the respective lower slot surface preferably has a short area 11' assigned in parallel to the disk surface, or may be constructed corresponding to the slot of the gripping heads 6 or 6'. The depth of this area is no larger than the width of the area on the bottom side of the wafer 3 permitted for such devices. Because of the relative displacement of the holding rake 10 with respect to the rods 7, the wafer disks 3 are reliably clamped in without the need to apply a high force. The clamping-in nevertheless ensures secure holding of the wafers 3 which permits also a swivelling of them from the horizontal into the vertical position. After the clamping-in has taken place, the stop element 16 is moved back.

Preferably, the swivelling of the wafers 3 is carried out such that the holding rake 10 comes to rest on the bottom side. As a result, in the vertical position, the gripping heads 6, 6' can be removed from the stop against the wafer edges by displacement and rotation of the rods 7, whereby the wafers 3 retain their position because of the configuration of the holding rake 10.

Figure 4:
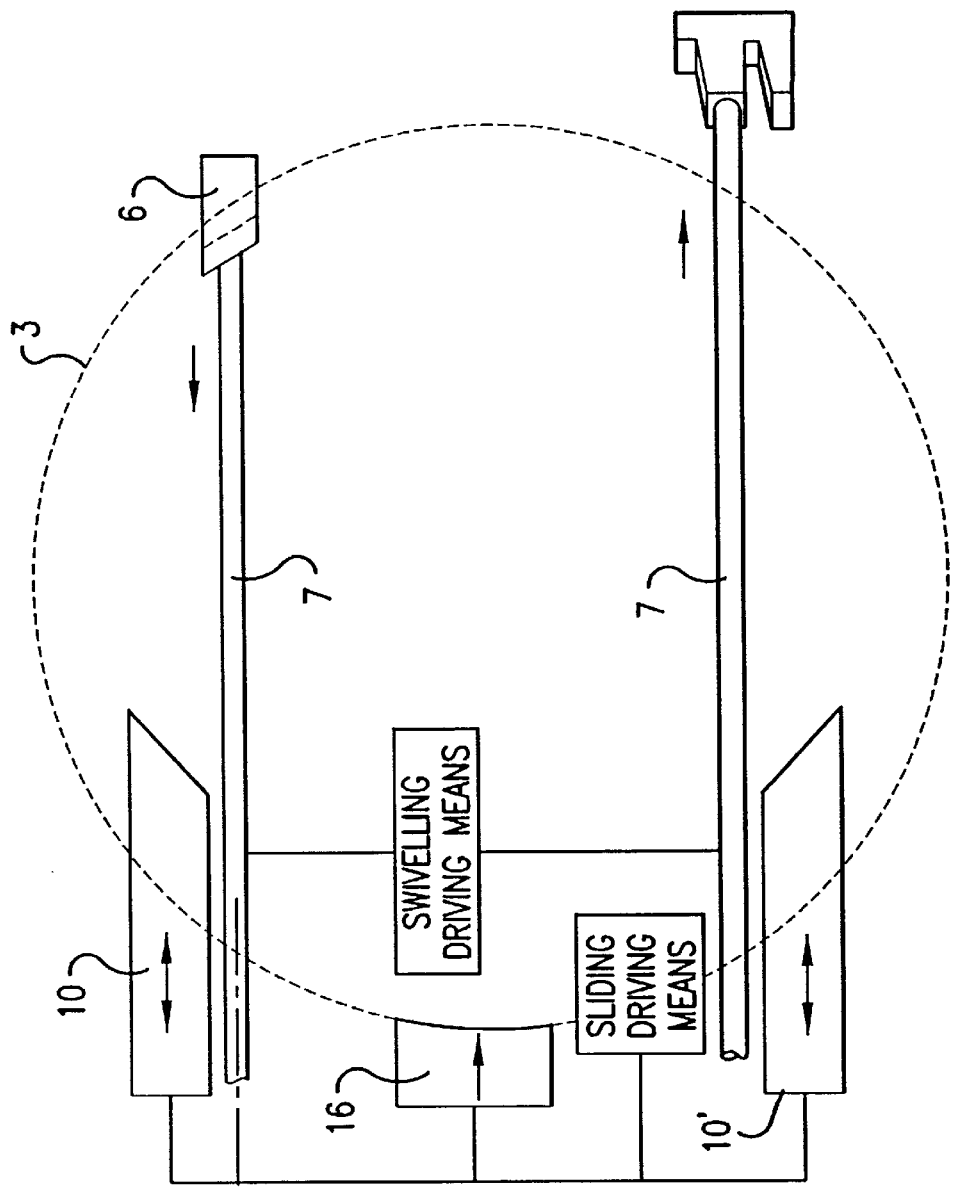
FIG. 4 is a top view of the gripping device of FIG. 3.

FIG. 4 is a schematic top view of a gripping device 1 according to FIG. 3. The upper area of FIG. 4 shows the gripping head 6 in the holding position as described above. The displacement of the stop element 16 in the direction of the arrow clamps the wafer disk 3 between the gripping head 6 and the stop element 16. In the same manner, the clamping-in of the wafer disks 3 then takes place between the holding rakes 10 and 10' of the gripper head 6.

Instead of clamping by the use of a force, a positioning of the stop element 16 can also take place into a predetermined position resulting from the precise diameter of the wafer 6. Thereby, damage to or deformation of the wafers because of the contact pressure can be prevented. The shaping of the gripping head 6 and of the holding rake 10, provide precise positioning with narrow play while nevertheless permitting swivelling of the entire arrangement. The movement of the gripping heads 6 and of the stop element 16 and of the holding rake 10 can take place by conventional hydraulic, pneumatic or electric driving devices.

The lower area of FIG. 4 also shows a gripping head 6' in a swivelled position. For this purpose, the rod 7 is moved by the movement of the gripping device 1 in the direction of the arrow away from the holding rake 10 and is then rotated by 90°. Displacement of the holding head 6' between two adjacent disks 3 is therefore now possible. This displacement is required when the gripping device 1 moves into the container 4, for the removal of the wafers 3, and later also during the pulling-back of the gripping device 1 from the processing carrier 5 and during movement out of the container 4 at the end of the processing operation. Of course, the holding rake 10 can consist of one or several parts, and the rods 7 can be arranged next to the holding rakes 10 or can be guided through the holding rakes 10 in recesses.

Figure 5:
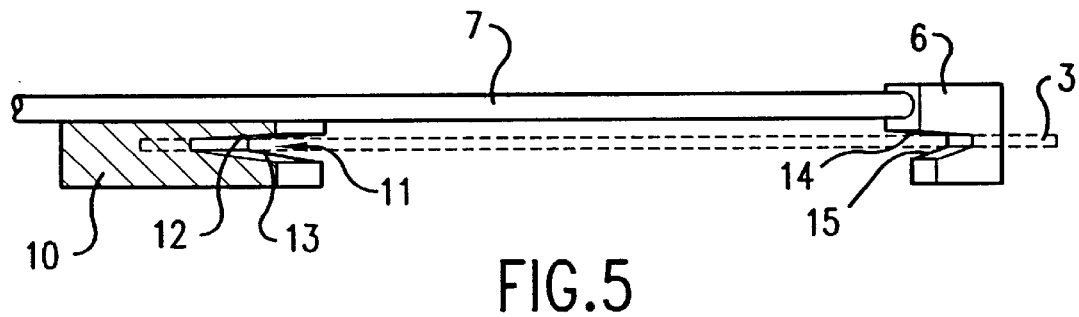
FIG. 5 is a longitudinal sectional view of a modified gripping device similar to FIG. 3 but for individual wafers.

According to the scope of the present invention, the device is also preferably suitable for processing an individual wafer, as schematically illustrated in FIG. 5. In this embodiment, the slot 11 of the holding rake 10 can have sloped surfaces 12, 13. Likewise, the gripping head 6 for an individual disk has respective inclined slot surfaces 14, 15.

Figure 6:
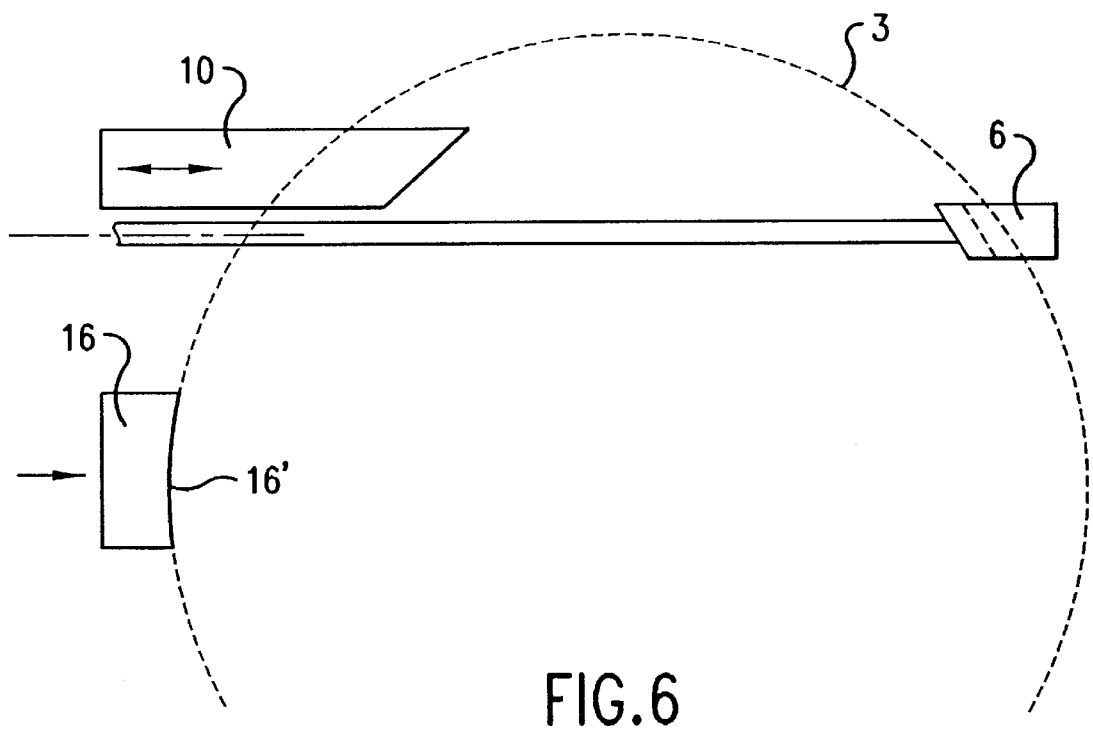
FIG. 6 is a top view of a gripping device similar to FIG. 4 but with an additional counterholder according to the invention.

The edges of the wafers 3 come to a stop against a counterholder 16 as schematically illustrated in FIG. 6 so that the wafers can be moved without any significant shaking out of the holding device of the cassettes via the gripping heads 6. The counterholder 16 has an elastic stop surface 16' aligned perpendicularly with respect to the surface of the wafers 3. As a result, the wafers 3 are removed from the cassette virtually without shaking by the gripping heads 6 and are introduced into the holding rake 10. Preferably, this counterholder 16 can rest against the edges of the wafers 3 also during the swivelling operation of the gripping device 1. Fast swivel movements of the gripping device 1 without any unacceptable or undesired shaking of the wafers 3 are thus advantageously permitted.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. Gripping device for removing and inserting wafers which are stacked spaced from one another in a container, comprising at least one holding rake with slots configured to receive the wafers, means for displacing said at least one holding rake to remove and insert the wafers in the container, at least one counterholder arranged relative to said at least one rake to engage a wafer surface for gripping a wafer for removal from and insertion into the container, rods provided with gripping heads having stop surfaces configured for stopping against edges of the wafers, and means for moving said rods relative to the associated gripping heads and for swivelling said rods, whereby at least one of said rods and at least one of the associated one of the gripping heads between two adjacent wafers are movable by said moving means so that one of the two adjacent wafers is located between said at least one counterholder and said at least one gripping head, and said at least one counterholder has an elastic stop surface aligned substantially perpendicularly to upper and lower surfaces of a wafer whose edge is held against said at least one counterholder during the removal from and insertion into the container.

2. The gripping device according to claim 1, wherein the gripping heads are arranged to be swivelled by 90°.

3. The gripping device according to claim 2, wherein, the holding rake has slots each of which has at least one slot surface respectively with an area extending parallel to the wafer surfaces.

4. The gripping device according to claim 3, wherein the area of the slot surface is on a bottom of the slots.

5. The gripping device according to claim 1, wherein the gripping heads are configured to have at least one slot surface sloped with respect to the wafer surfaces.

6. The gripping device according to claim 5, wherein the gripping heads are arranged to be swivelled by 90°.

7. The gripping device according to claim 1, wherein the gripping heads have associated stop faces aligned perpendicularly with respect to the wafer surfaces.

8. The gripping device according to claim 7, wherein the gripping heads are arranged to be swivelled by 90°.

9. The gripping device according to claim 7, wherein two gripping heads are provided on two rods for gripping an individual wafer and the gripping heads and the holding rake have slot surfaces inclined with respect to the wafer surfaces.

10. The gripping device according to claim 9, wherein the gripping heads are arranged to be swivelled by 90°.

11. The gripping device according to claim 1, wherein the gripping heads are configured to have at least one slot surface sloped with respect to the wafer surfaces.

12. The gripping device according to claim 1, wherein the gripping heads have a thickness smaller than a mutual distance between the wafers stacked in the container.

13. The gripping device according to claim 12, wherein the gripping heads are arranged to be swivelled by 90°.

14. The gripping device according to claim 13, wherein the gripping heads are configured to have at least one slot surface sloped with respect to the wafer surfaces.

15. The gripping device according to claim 1, wherein the gripping heads have associated stop faces aligned perpendicularly with respect to the wafer surfaces.

16. The gripping device according to claim 1, wherein the holding rake is a multi-part component.

17. The gripping device according to claim 1, wherein driving devices are operatively associated with the gripping heads for the swivel movement of the gripping heads and for sliding movement of the holding rake and the at least one counterholder.

18. The gripping device according to claim 17, wherein the driving devices are pneumatic or electric driving devices.

19. The gripping device according to claim 1, wherein at least two of the gripping heads respectively are moved parallel with one another and are arranged to come to a stop at the edge of the same wafer.

20. The gripping device according to claim 1, wherein said at least counterholder and said at least holding rake are successively displaceable in order to contact and to provide said wafers with a predetermined handling position.

21. The gripping device according to claim 1, wherein each of said swivellable rods is provided with a gripping head.

22. The gripping device according to claim 1, wherein said swivellable rods are swivellable about a longitudinal axis thereof.

23. Use of a gripping device for removing and inserting wafers which are stacked spaced from one another in a container in a wafer processing system, comprising at least one holding rake with slots configured to receive the wafers, means for displacing said at least one holding rake to remove the wafers from and insert the wafers into the container, at least one counterholder arranged relative to said at least one holding rake to engage a wafer surface for gripping the wafer for removal from and insertion into the container, rods provided with gripping heads having stop surfaces configured for stopping against edges of the wafers, and means for moving said rods relative to the associated gripping heads and for swivelling said rods, whereby at least one of said rods together with an associated one of the gripping heads is between said at least one counterholder and said at least one gripping head, and said at least one counterholder has an elastic stop surface aligned substantially perpendicularly to said wafer surface held against said at least one counterholder.

* * * * *